(12) United States Patent
Boetto et al.

(10) Patent No.: US 7,889,515 B2
(45) Date of Patent: Feb. 15, 2011

(54) EMI SHIELDING ASSEMBLIES AND RELATED METHODS OF RETAINING COMPONENTS THEREOF TOGETHER

(75) Inventors: Joseph C. Boetto, Hoffman Estates, IL (US); James R. Fikert, Wonder Lake, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 102 days.

(21) Appl. No.: 12/046,434

(22) Filed: Mar. 11, 2008

(65) Prior Publication Data

US 2009/0207579 A1 Aug. 20, 2009

Related U.S. Application Data

(60) Provisional application No. 61/029,215, filed on Feb. 15, 2008.

(51) Int. Cl.
*H05K 9/00* (2006.01)

(52) U.S. Cl. .................. 361/818; 361/800; 361/816; 361/807; 361/810; 174/350; 174/50

(58) Field of Classification Search .............. 174/354, 174/350, 50; 277/648; 361/818, 816, 807, 361/810
See application file for complete search history.

(56) References Cited

U.S. PATENT DOCUMENTS

| | | | |
|---|---|---|---|
| 2,135,807 A | 11/1938 | Fitzgerald | |
| 3,130,489 A | 4/1964 | Schlage | |
| 3,729,804 A | 5/1973 | Middleton | |
| 4,780,570 A * | 10/1988 | Chuck | 174/369 |
| 4,783,087 A | 11/1988 | DeCore et al. | |
| 5,442,885 A | 8/1995 | Laven et al. | |
| 5,895,884 A * | 4/1999 | Davidson | 174/372 |
| 6,044,537 A | 4/2000 | Tokuda et al. | |
| 6,063,999 A * | 5/2000 | Kelly | 174/351 |
| 6,259,609 B1 * | 7/2001 | Kurz | 361/818 |
| 6,283,770 B1 | 9/2001 | Leung et al. | |
| 6,332,618 B1 * | 12/2001 | Karlsson | 277/648 |
| 6,426,459 B1 * | 7/2002 | Mitchell | 174/382 |

(Continued)

FOREIGN PATENT DOCUMENTS

DK    EP 1 231 827 A1 * 8/2002

(Continued)

*Primary Examiner*—Hung S. Bui
*Assistant Examiner*—Steven Sawyer
(74) *Attorney, Agent, or Firm*—Harness, Dickey & Pierce, P.L.C.

(57) ABSTRACT

In one exemplary embodiment, an electromagnetic interference (EMI) shielding apparatus generally includes a shield and a gasket. The gasket includes at least one tab formed monolithically with the gasket and attached to a support or portion of the gasket. The at least one tab is movable relative to the support from a first, pre-installed configuration in which the at least one tab is generally co-planar with the support to a second, installed configuration in which the at least one tab extends generally outwardly relative to the support. Movement of the at least one tab from the first configuration to the second configuration may position the at least one tab at least partially within the at least one opening of the shield. Frictional engagement of the at least one tab within the at least one opening may help retain the relative positioning of the gasket to the shield.

37 Claims, 10 Drawing Sheets

U.S. PATENT DOCUMENTS

| | | |
|---|---|---|
| 6,426,881 B1 * | 7/2002 | Kurz .......................... 361/800 |
| 6,483,024 B1 * | 11/2002 | Smithson et al. ............ 174/354 |
| 6,552,261 B2 * | 4/2003 | Shlahtichman et al. ...... 174/384 |
| 2001/0026048 A1 * | 10/2001 | Proctor et al. ............... 277/603 |
| 2003/0227759 A1 | 12/2003 | Haworth |
| 2007/0049082 A1 * | 3/2007 | Wu ............................ 439/160 |

FOREIGN PATENT DOCUMENTS

GB           989417           4/1965

* cited by examiner

EMI SHIELDING ASSEMBLIES AND RELATED METHODS OF RETAINING COMPONENTS THEREOF TOGETHER

CROSS-REFERENCE TO RELATED APPLICATION

This application claims the benefit of U.S. Provisional Application No. 61/029,215 filed Feb. 15, 2008. The disclosure of the above application is incorporated herein by reference.

FIELD

The present disclosure relates generally to electromagnetic interference (EMI) shielding, and more particularly to electromagnetic EMI shielding assemblies and related methods of coupling two or more components of an EMI shielding apparatus together.

BACKGROUND

The statements in this section merely provide background information related to the present disclosure and may not constitute prior art.

Electrically-conductive gaskets sometimes are configured to provide electromagnetic interference (EMI) shielding. To shield EMI effectively, a gasket should be capable of absorbing or reflecting EMI as well as establishing a continuous electrically conductive path across the gap in which the gasket is disposed. A gasket may be used for maintaining electrical continuity across a structure. The installed gasket essentially closes or seals any interface gaps and establishes a continuous electrically-conductive path there across.

As used herein, the term "EMI" should be considered to generally include and refer to EMI emissions and radio frequency interference (RFI) emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

In one exemplary embodiment, an electromagnetic interference (EMI) shielding apparatus generally includes a shield and a gasket. The gasket includes at least one tab formed monolithically with the gasket and attached to a support or portion of the gasket. The at least one tab is movable relative to the support from a first, pre-installed configuration in which the at least one tab is generally co-planar with the support to a second, installed configuration in which the at least one tab extends generally outwardly relative to the support. Movement of the at least one tab from the first configuration to the second configuration may position the at least one tab at least partially within the at least one opening of the shield. Frictional engagement of the at least one tab within the at least one opening may help retain the relative positioning of the gasket to the shield.

In another exemplary embodiment, an assembly generally includes first and second components. At least one support and at least one wing are formed monolithically with the first component. The at least one wing depends outwardly from the at least one support and is engaged within the at least one opening, thereby helping retain the relative positioning of the first component to the second component.

In an additional exemplary embodiment, an EMI shielding apparatus includes a gasket and a shield. The shield has at least one embossed protrusion monolithically formed with the shield. The gasket has at least one opening configured to engagably receive the at least one embossed protrusion such that engagement of the at least one embossed protrusion within the at least one opening helps retain the relative positioning of the gasket to the shield, prior to welding of the gasket to the shield. The gasket may be welded to a surface of the shield by a weld.

Other exemplary embodiments include gaskets for attachment to shielding structures. In one such embodiment, a gasket may include at least one support formed monolithically with the gasket. At least one flap may be formed monolithically with the gasket and be attached to the support. The at least one flap may be forcibly movable relative to the support from a first, pre-installed configuration in which the at least one flap is generally co-planar with the support to a second, installed configuration in which the at least one flap extends generally outwardly relative to the support. Movement of the at least one flap from the first configuration to the second configuration may position the at least one flap at least partially within the at least one opening of the shield. Frictional engagement of the at least one flap within the at least one opening may help retain the relative positioning of the gasket to the shield.

Further embodiments relate to methods of assembling components. In one exemplary embodiment, a method generally includes positioning at least one winged tab of a first component in general alignment with at least one opening of a second component. The method may also include deforming the at least one winged tab of the first component in a direction generally away from the first component and towards the at least one opening of second component to position the at least one winged tab into the at least one opening of the second component. Frictional engagement of the at least one winged tab within the at least one opening may help retain the relative positioning of the first and second components.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1A:
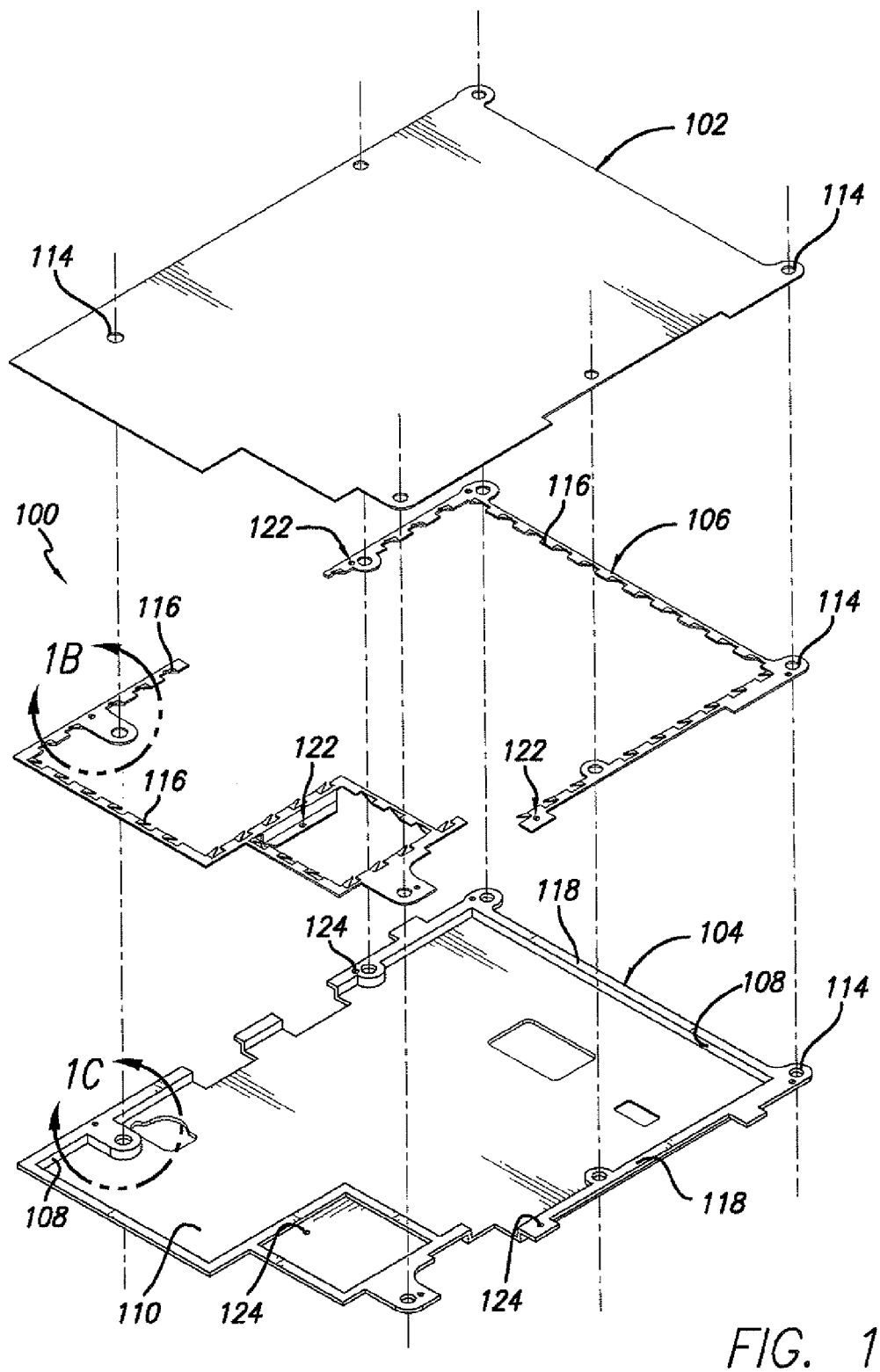
FIG. 1A is an exploded perspective view of an exemplary embodiment of a shielding apparatus, which may be used to provide electromagnetic interference shielding for one or more electrical components on a printed circuit board.

The following description is merely exemplary in nature and is not intended to limit the present disclosure, application, or uses. It should be understood that throughout the drawings, corresponding reference numerals indicate like or corresponding parts and features.

In accordance with various exemplary embodiments of the present disclosure, the inventors hereof have developed methods and interlocks (e.g., connection formed via openings and tabs/wings/flaps, connection formed via openings and embossed protrusions, snap-fit connection, snap-on connection, etc.) for retaining (e.g., staking, etc.) a gasket (e.g., formed finger gasket, etc.) to an EMI shielding component (e.g., drawn EMI shielding can, etc.). The interlock may be used for retaining and/or temporarily locating the gasket relative to the EMI shielding component, for example, prior to welding (e.g., laser welding, etc.) the gasket to the EMI shielding component. In other embodiments, the gasket may be securely retained to the shield by the interlock without any need for further securement (e.g., welding, mechanical fasteners, etc.) of the gasket to the shield.

In some exemplary embodiments, a drawn EMI shielding can may include one or more thru holes, and a finger gasket may have tabs, wings, or flaps that are formed (e.g., pierced, cut, sheared, etc.) monolithically with the finger gasket. In such embodiments, the mating process of the finger gasket to the EMI shielding can may thus include the use of tooling that drives or forcibly moves the finger gasket's winged tabs into the thru hole(s) of the EMI shielding drawn can, thus acquiring location and retention of the finger gasket to the EMI shielding drawn can. The formed winged tabs are bent, deformed, or moved downwardly to compressively squeeze and fit within the inside diameter of the thru hole. The winged tabs preferably remain confined within the thru hole and within the envelope of the shield, such that the tabs do not protrude outwardly below the lower surface of the EMI shielding drawn can. Accordingly, various exemplary embodiments disclosed herein may help provide better part handling and locating as compared to manual operator handling and part locating of what typically are rather fragile components. This, in turn, may also help increase production yields, and reduce the number of locating nests/blocks and operators that would otherwise be required to stage these components ahead of laser welding. In some exemplary embodiments, one or more finger gaskets may be introduced directly to an EMI shielding drawn can during the stamping operation, thereby eliminating the need for multiple fixturing nests, operator handling, and/or running at an elevated production speed. Such exemplary embodiments are thus suitable for down stream in-line laser welding processes for achieving higher production output.

In other embodiments, the mating process may include moving the tabs in a first direction relative to the portion of the gasket supporting the tabs, so as to reduce the footprint of the tabs for readily fitting within an opening of a shield. For example, the tabs may be moved or deformed such that the tabs are slanted at an angle of about sixty degrees, etc. relative to the portion of the gasket to which the tabs are connected. The shield may then be moved relatively towards the gasket (e.g., shield moved or driven upwards or towards the gasket while the gasket is clamped or held stationary, etc.) for moving or deforming the tabs in a second direction generally opposite the first direction and reduce the angle between the tabs and the gasket portion to which the tabs are connected (e.g., reduce the angle from about sixty degrees to about forty-five degrees, etc.). This movement in the second direction causes the footprint of the tabs to increase, which, in turn, creates good frictional engagement of the tabs with the sidewalls of the opening. In some of these embodiments, the frictional engagement of the tabs with the sidewalls may be sufficient such that further securement (e.g., welding, etc.) is not needed between the shield and the gasket. Accordingly, the tabs and corresponding openings may be configured to provide a connection that is tailored (e.g., with a retention strength, connection strength, etc.) suitable for the intended end-use or application.

Figure 1B:
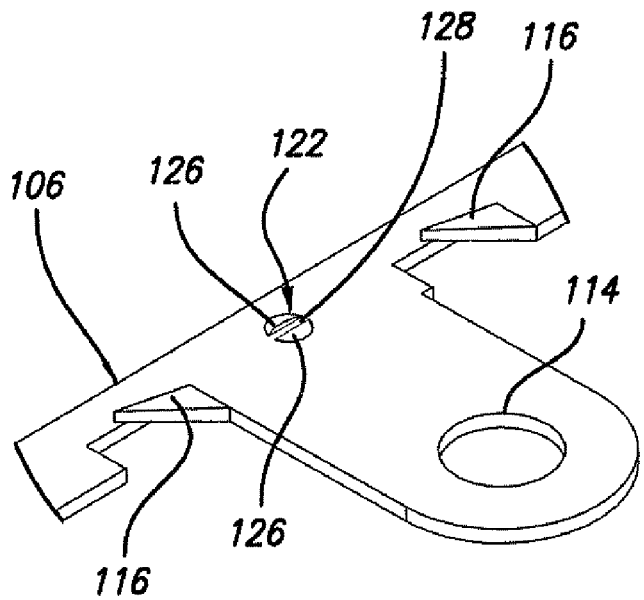
FIG. 1B is an enlarged perspective view of the gasket section designated 1B shown in FIG. 1A.
Figure 1C:
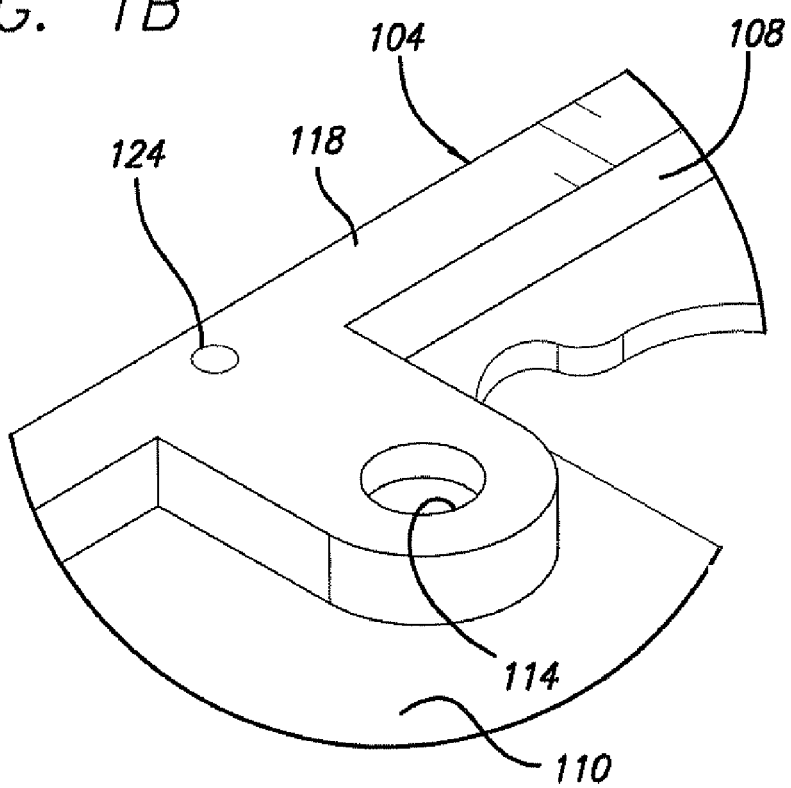
FIG. 1C is an enlarged perspective view of the shield section designated 1C shown in FIG. 1A.

Referring now to the drawings, FIGS. 1 through 4 illustrate an exemplary embodiment of a shielding apparatus 100 embodying one or more aspects of the present disclosure. As shown in FIG. 1, the illustrated shielding apparatus 100 is configured (e.g., sized, shaped, constructed, etc.) to be installed to a printed circuit board 102 (a PCB, and more broadly a substrate) and is suitable for use in providing electromagnetic interference (EMI) shielding to one or more electrical components (not shown) mounted on the PCB 102. The PCB 102 and shielding apparatus 100 may be located, for example, within an electrical device (e.g., a cellular phone, a computer, etc.).

The illustrated shielding apparatus 100 generally includes a shield 104 and a gasket 106. The gasket 106 may be retained to the shield 104 (e.g., FIGS. 2, 3, etc.), for example, to provide an EMI shielding barrier between the shield 104 and the PCB 102 when the shield 104 is installed to the PCB 102. This may help provide EMI shielding for/to the one or more electrical components mounted on the PCB 102.

For this particular embodiment, the shield 104 may also be referred to as a drawn EMI shielding can, and the gasket 106 may also be referred to as a finger gasket 106. The illustrated shield 104 and gasket 106 are but two specific types of components that may be used with aspects of the invention, as other embodiments may include other components besides shields and gaskets. Still further embodiments may include a shield and/or gasket with a different configuration than that shown in the figures. For example, other embodiments may include a shield is not formed by a manufacturing process besides drawing.

As shown in FIG. 1, the illustrated shield 104 includes side walls 108 and a cover or lid portion 110 monolithically formed as a single structure. For example, the shield 104 may be formed by drawing (e.g., over a die, etc.), bending, stamping, folding, etc. at least part of the shield 104, or by a combination thereof, to produce the final desired shape of the shield 104 (e.g., of the side walls 108 and cover 110, etc.). The finally shaped shield 104 is configured (e.g., sized, shaped, constructed, etc.) to be installed (e.g., surface mounted, secured, etc.) to the PCB 102 by any acceptable means such as soldering, mechanical fastening, etc. In the illustrated embodiment, the shield 104 is configured (e.g., sized, shaped, constructed, etc.) to be installed to the PCB 102 by mechanical fasteners (not shown) through corresponding openings 114 in the shield 104, gasket 106, and PCB 102. In other exemplary embodiments, shields may include frames and separate covers such that the covers are attachable to (and possibly detachable from) the frames.

The shield 104 may be formed from various materials, such as a piece of electrically-conductive material including, for example, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the shield 104 may be formed from a plastic material coated with electrically-conductive material.

With continued reference to FIG. 1, the illustrated gasket 106 is positioned between the shield 104 and the PCB 102 and includes resilient spring fingers 116 along the gasket 106. The spring fingers 116 may be configured for contacting the PCB 102 to provide an electrical grounding pathway or connection between the gasket 106, the shield 104, and the PCB 102. A wide range of materials may be used for the gasket 106, preferably electrically-conductive materials having sufficient resiliency or springiness for permitting the spring fingers 116 to be at least partially deflected during installation of the shield 104 and gasket 106 to the PCB 102. For example, this resiliency may allow the spring fingers 116 to deflect or flex, and then to respond with a sufficient restorative force for biasing the spring fingers 116 against a portion of the PCB 102. This biasing force may help the spring fingers 116 maintain good contact with the PCB 102. In some exemplary embodiments, gaskets may include formed finger gaskets (e.g., formed by bending, stamping, folding, etc.) made from beryllium copper alloys or other suitable electrically-conductive materials.

Figure 2:
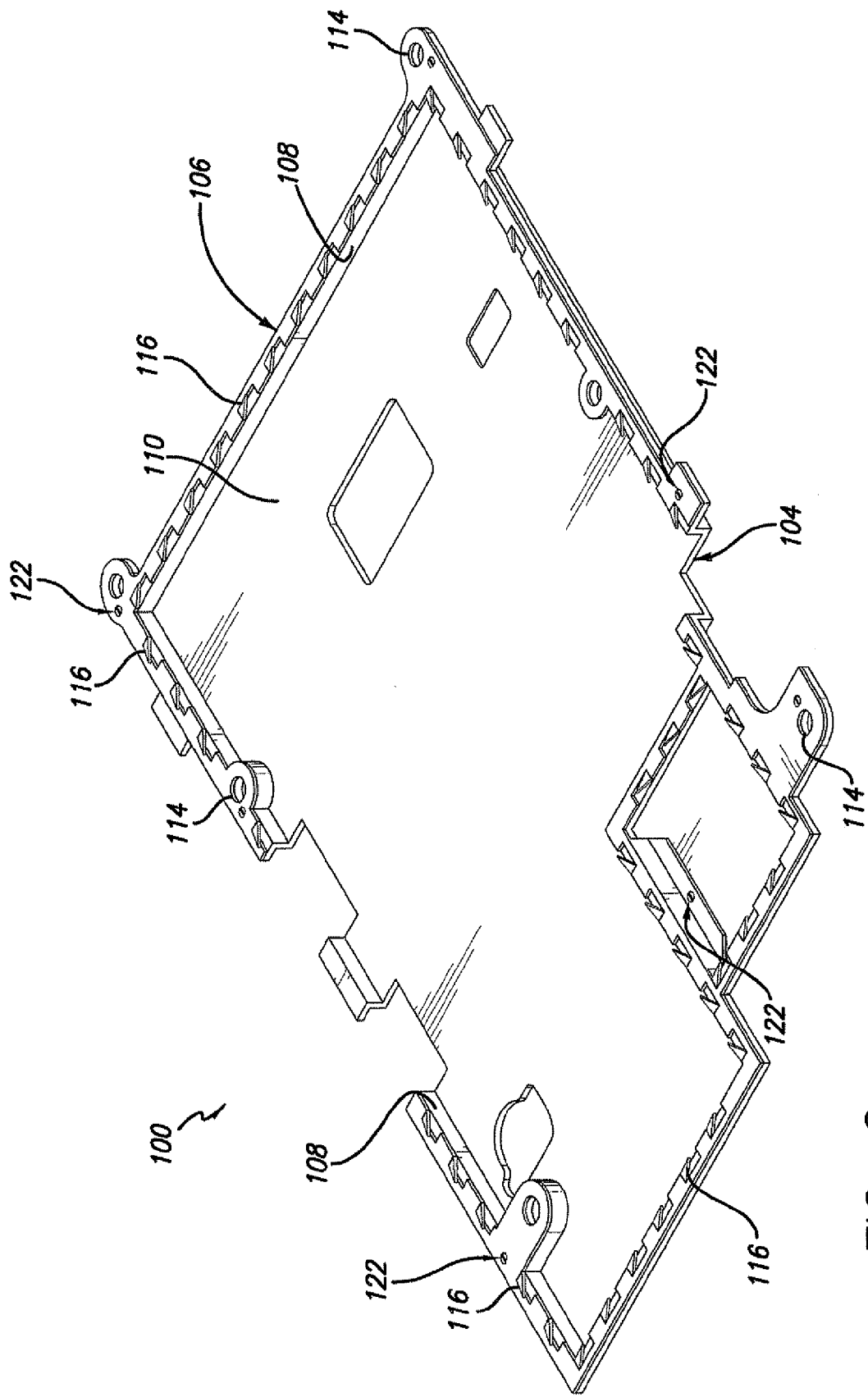
FIG. 2 is a perspective view of the shield and gasket of the shielding apparatus shown in FIG. 1A with the gasket retained to the shield by engagement of the gasket's tabs within the corresponding openings of the shield.

As shown in FIG. 2, the gasket 106 may be retained to the shield 104 along outwardly extending footing surfaces 118 of the shield's walls 108 by wing connectors 122. The gasket 106 may also be retained to the shield 104 at select points on the cover 110 of the shield 104 by wing connectors 122. In this example, the wing connectors 122 are formed as part of the gasket 106 and are configured (e.g., sized, shaped, constructed, etc.) to engagingly fit into corresponding openings 124 (e.g., thru-holes in FIG. 1, etc.) in the shield 104 (e.g., in the footing surfaces 118 of the shield's walls 108 as well as in the shield's cover 110) to help locate the gasket 106 in proper position relative to the shield 104 and help secure the gasket 106 to and/or retain the gasket 106 on the shield 104. For example, the wing connectors 122 may be used to properly locate and initially secure or retain the gasket 106 to the shield 104 prior to welding (e.g., laser welding, etc.) the gasket 106 to the shield 104 and/or prior to installing the shield 104 and gasket 106 to the PCB 102. The wing connectors 122 can thus help initially position the gasket 106 on the shield 104 prior to further installation and/or assembling procedures (e.g., welding the gasket 106 to the shield 104, installing the gasket 106 and shield 104 to the PCB 102, etc.). The wing connectors 122 of the gasket 106 and the corresponding openings 124 of the shield 104 may together be broadly referred to as connector assemblies or, in the alternative, retention points for use in connecting the gasket 106 to the shield 104. The illustrated apparatus 100 thus includes seven retention points. In other exemplary embodiments, shielding apparatus may include more than or less than seven retention points and/or may include one or more retention points located at different locations about the shielding apparatus within the scope of the present disclosure. In addition, the shield's openings 126 are shown as thru-holes. Other embodiments may include openings that extend only partially through the shield.

Figure 3:
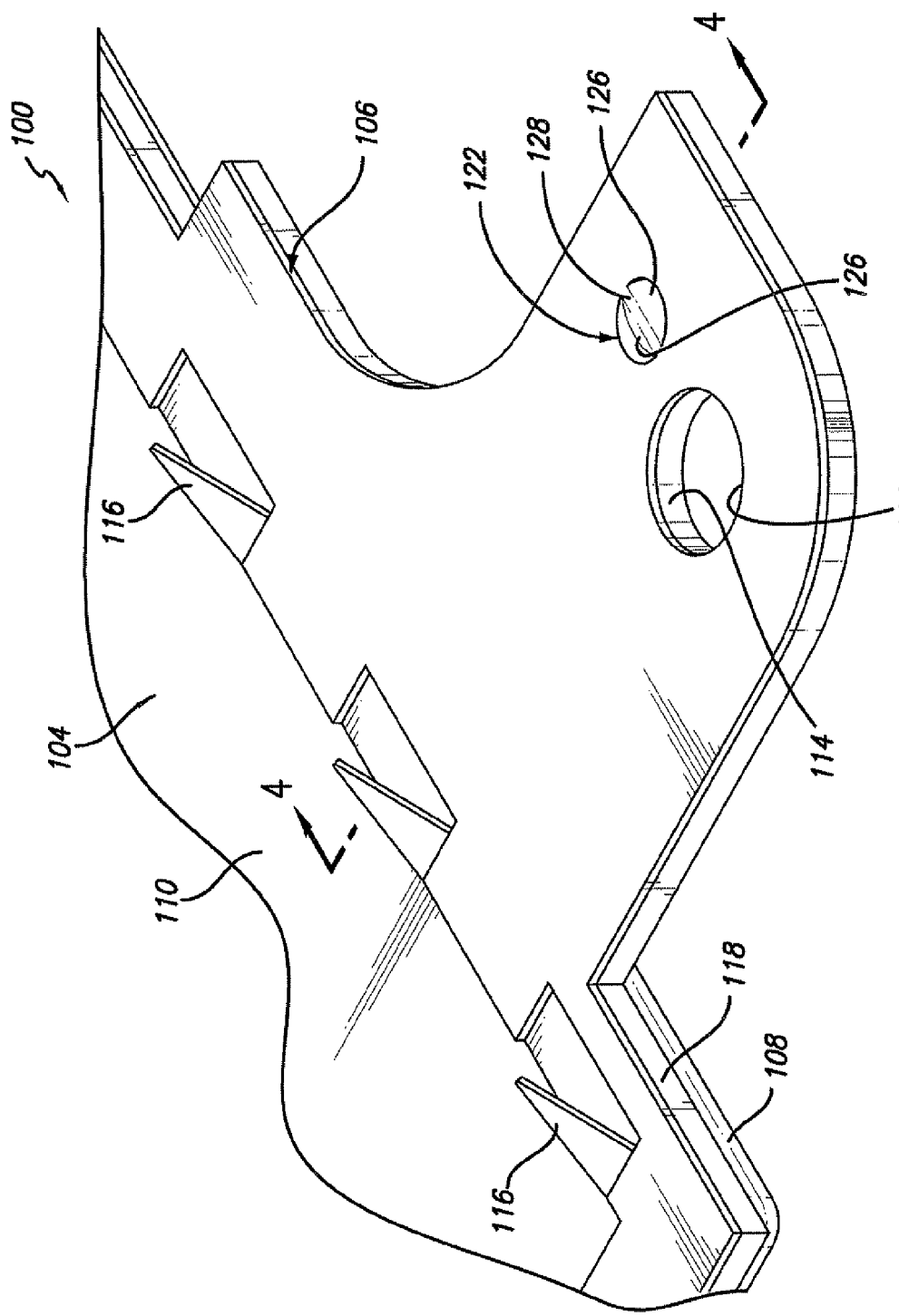
FIG. 3 is an enlarged fragmentary perspective view of a portion of the shielding apparatus shown in FIG. 2, and illustrating a wing connector retaining the gasket to the shield.
Figure 4:
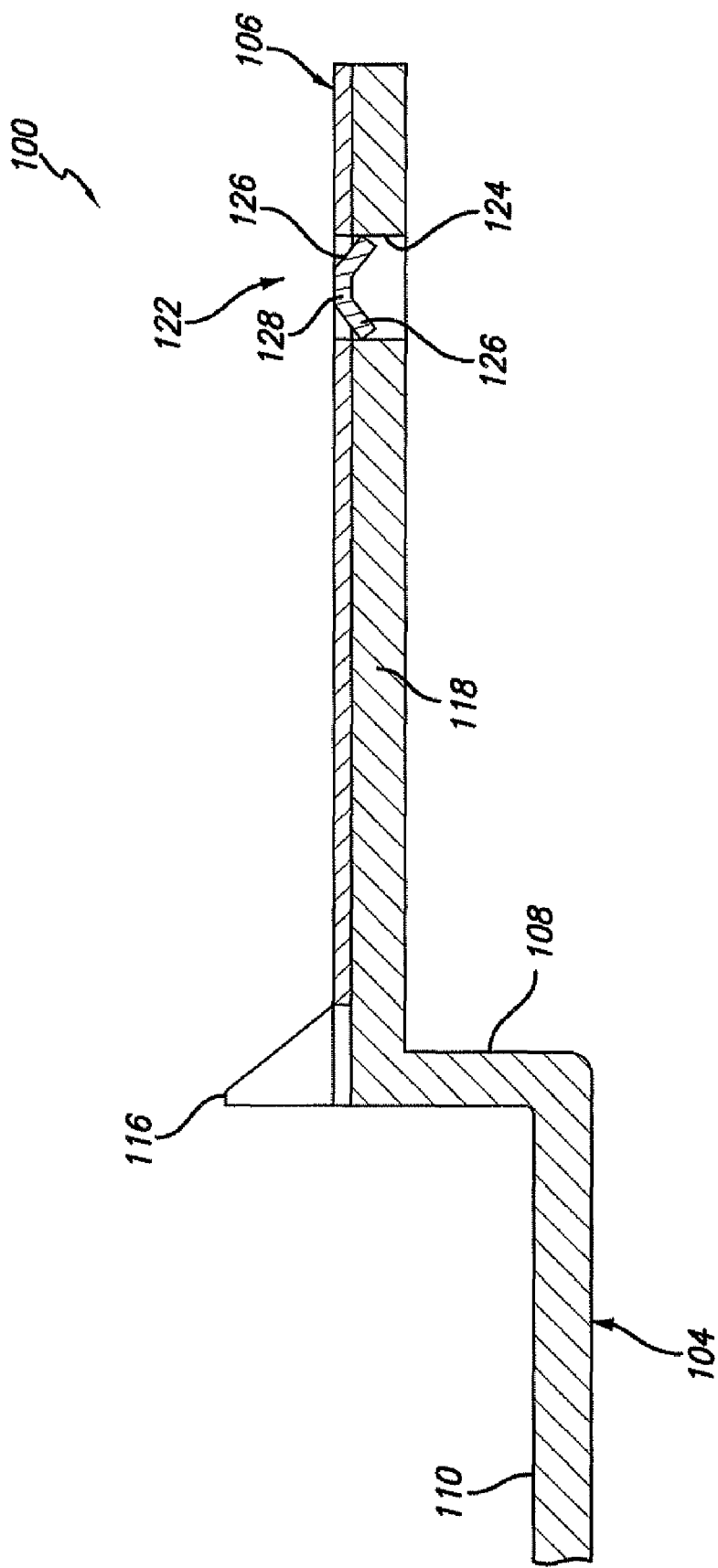
FIG. 4 is a section view taken in a plane including line 4-4 of FIG. 3, and illustrating engagement of the gasket's tabs within the opening of the shield.
Figure 5:
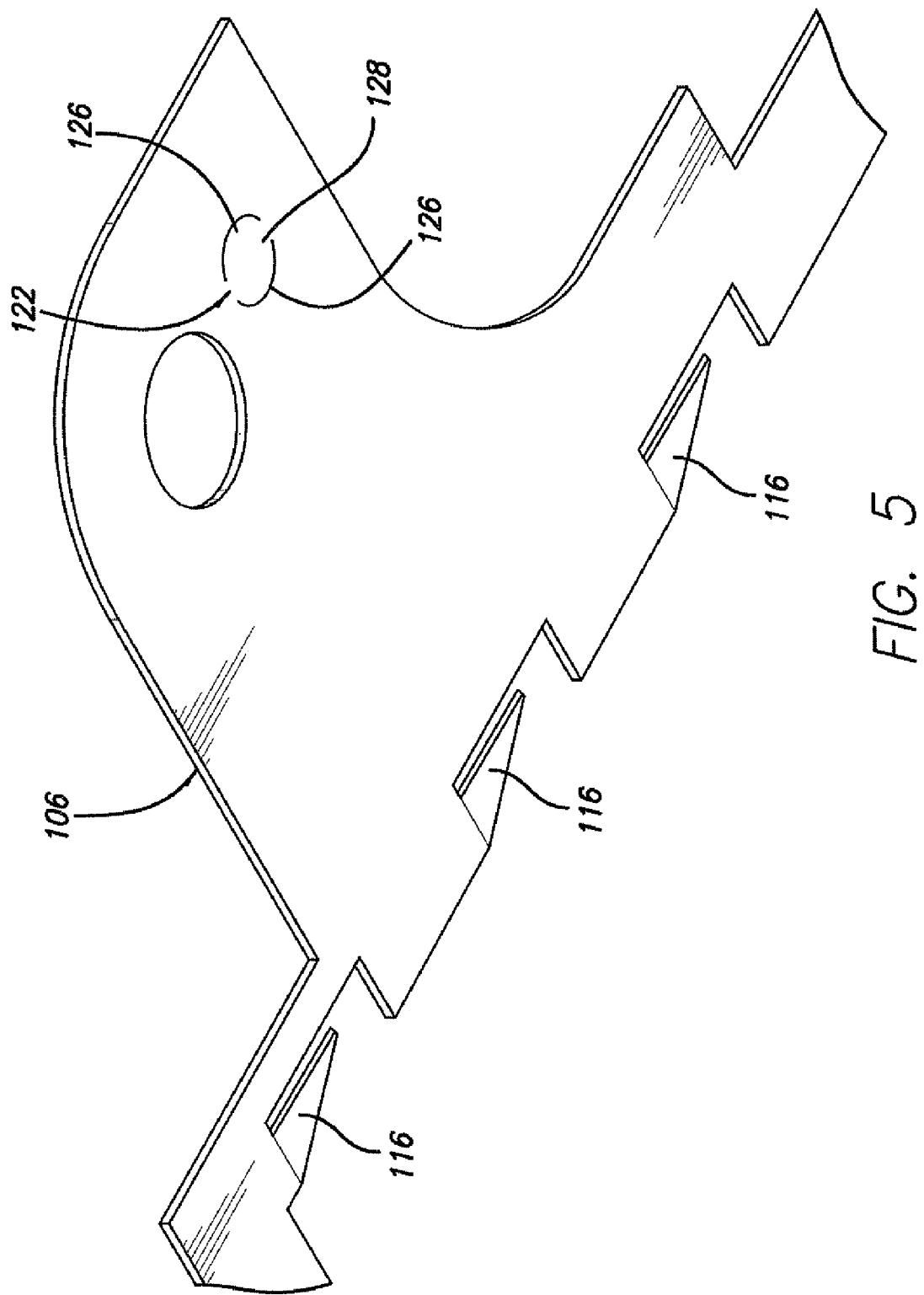
FIG. 5 is a lower perspective view of a portion of a gasket shown in a first, pre-installation configuration in which the gasket has been provided with semi-circular cuts defining the profile for two tabs of a wing connector that are generally co-planar with the portion of the gasket supporting the tabs.
Figure 6:
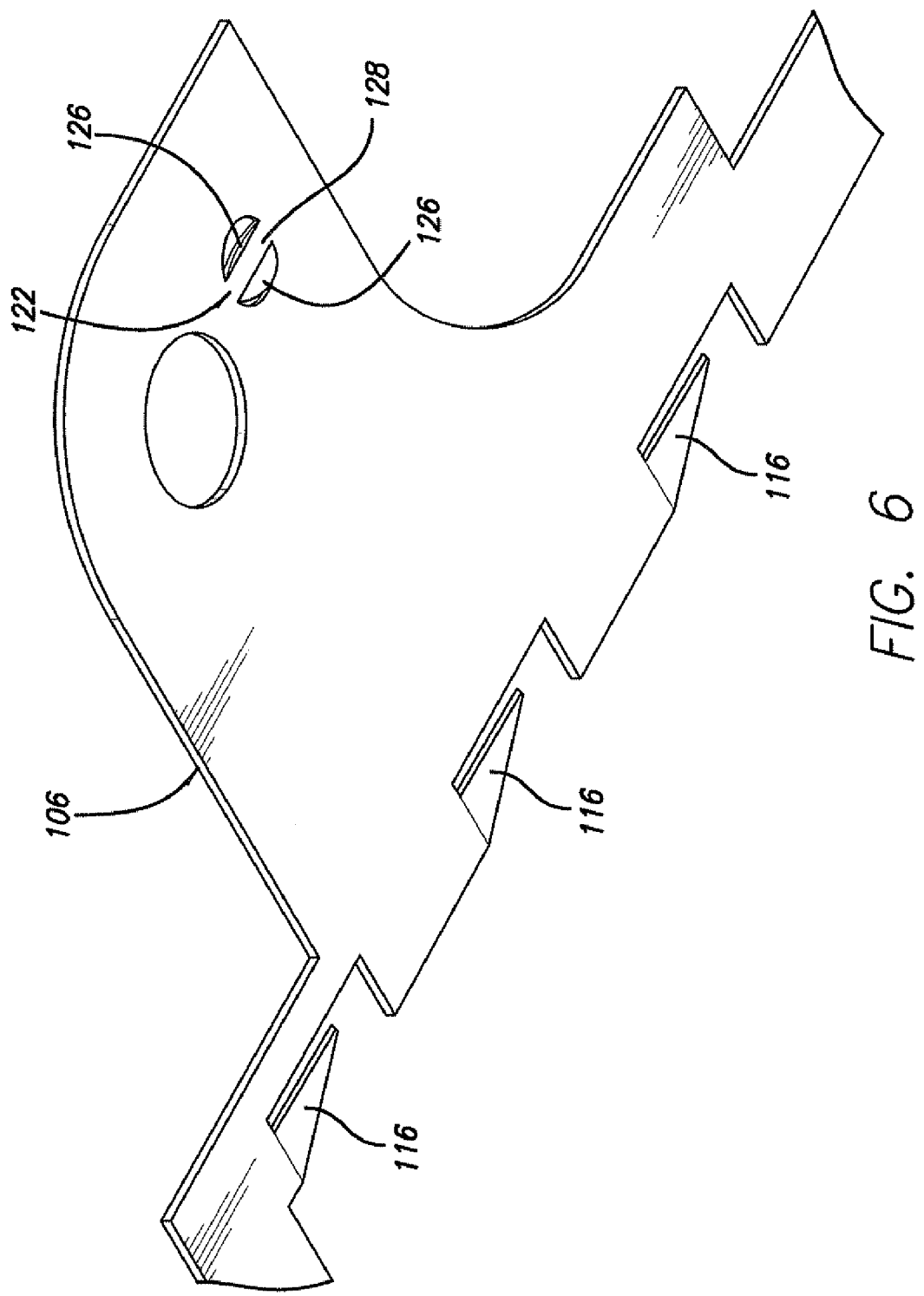
FIG. 6 is a lower perspective view of the gasket portion shown in FIG. 5 where the tabs of the wing connector are shown in a second configuration after the tabs have been moved outwardly away from the portion of the gasket supporting the tabs.

With additional reference now to FIGS. 3 and 4, the illustrated wing connectors 122 are formed as part of the gasket 106 and generally include two tabs, wings, or flaps 126 formed monolithically with the gasket 106. As shown in FIG. 5, the tabs 126 may be formed by cutting (e.g., piercing, perforating, etc.) a part of the gasket 106 to form or define the profile or outer periphery of the tabs 126. In this first, pre-installation configuration shown in FIG. 5, the tabs 126 are generally co-planar with the portion of the gasket supporting the tabs 126. The tabs 126 are generally located within the thickness or envelope of the gasket 106 such that the tabs 126 do not protrude (or protrude only slightly) outwardly beyond the gasket 106. Alternative embodiments, however, may include the tabs 126 at least partially protruding outwardly beyond the gasket 106. In which case, the protruding portion of the tabs 126 may serve as a self-centering feature for helping center, align, or locate the tabs 126 with the corresponding opening 124 of the shield 104. In embodiments in which self-centering of the tabs 126 may be preferred, an additional process may be performed after cutting the tabs 126 to push or move the tabs 126 to protrude outwardly beyond the gasket 106 to a greater extent or degree than what the tabs 126 protruded, if any, solely from the cutting or piercing operation. In yet other embodiments, e.g., in which no self-centering is desired, the tabs 126 may be flattened or pushed back so as to eliminate or reduce the extent or degree to which the tabs 126 protrude, if any, after the cutting or piercing operation.

In some embodiments, the tabs 126 may also have sufficient resiliency or springiness such that after the insertion force is removed from the tabs 126, the resiliency of the material from the tabs 126 may respond with a sufficient restorative force for biasing the tabs 126 back towards their original flattened, first configuration and against the inner surfaces of the opening 124 of the shield 104. This, in turn, may help provide a better frictional retention force between the tabs 126 and shield 104.

The exemplary embodiment illustrated in FIG. 5 shows semi-circular cut lines that form the tabs 126. Alternative embodiments may include other shapes besides semi-circular. For example, another embodiment may include three tabs formed by cut lines that would thus not be semi-circular.

The cutting may be done, for example, when forming the gasket 106 (e.g., when bending, stamping, folding, etc. the gasket 106 during manufacture, etc.). The cut tabs 126 remain connected or attached (e.g., hinged, etc.) to the gasket 106 at a central support or member 128 (which is part of the gasket 106). In some embodiments, the cut tabs 126 may also remain connected to the gasket 106 at any perforation points that may be left when the gasket 106 is cut to form the tabs 126. In which case, the tabs 126 may then be broken away from the gasket 106 at the perforation points, while remaining connected to the gasket 106 at the central support 128, when the tabs 126 are moved downwardly from the support 128 and into the opening 124 of the shield 104.

As shown in FIG. 4, the tabs 126 also include a second, installed configuration in which the tabs 126 (after being forcibly moved from the first configuration) extend or slant generally outwardly from the support 128 (e.g., at an angle of about 45 degrees, etc.) and are engaged within the opening 124 of the shield 104. In other embodiments, the tabs 126 may be moved to a greater or lesser extent so as to define a different angle (e.g., 60 degrees, etc.) with the support 128 of the gasket 106.

The wing connectors 122 may include more than or less than two tabs 126. For example, one embodiment may include one or more wing connectors with only one tab. Another embodiment may include one or more wing connectors with three tabs. The wing connectors 122 may also be formed by other suitable methods, within the scope of the present disclosure.

The tabs 126 of each wing connector 122 are configured (e.g., sized, shaped, constructed, etc.) to be forcibly moved, pushed, bent, pressed, deformed, etc. relative to the support 128 (e.g., out of generally co-planarity or out of the plane with the gasket 106, etc.), which in FIGS. 3 and 4 is a generally downward direction. For example, a tool (e.g., a punch, etc.) may be used to engage and apply force (e.g., via a single downward stroke of a punch applying force, etc.) to the tabs 126. By way of further example, a force may be applied by a tool to the upper surfaces of the tabs 126 in a generally downward direction that is generally parallel to the direction of movement or insertion of the tabs 126 into the opening 124 of the shield 104. The applied force has a sufficient magnitude to forcibly move the tabs 126 (and, in some embodiments, break the tabs 126 away from any perforation points left between the tabs 126 and the gasket 106 when the gasket 106 is cut to form the tabs 126) into one of the corresponding openings 124 of the shield 104. FIG. 4 shows the second, installed configuration in which the tabs 126 (after being forcibly moved from the first configuration) extend or slant generally outwardly from the support 128 and are engaged within the opening 124 of the shield 104. The engagement of the tabs 126 within the opening 124 helps retain the relative positioning of the gasket 106 to the shield 104, before further securement (e.g., welding, etc.) of the gasket 106 and shield 104. In some embodiments, the connection (and retention force provided thereby) formed by engagement of the gasket's tabs 126 within the shield's opening 124 may be sufficiently strong and/or may be associated with sufficient electrical conductivity between the gasket 106 and shield 104 such that further securement (e.g., welding, etc.) is not needed or performed. Depending on the particular embodiment and configuration of the tabs 126 to the openings 124, the retention force of the gasket 106 to the shield 104 may be provided in some embodiments by the frictional engagement of the tabs' side edge portions, with the tips or free ends of the tabs 126 providing little to no frictional engagement with the opening 124.

With continued reference to FIG. 5, the openings 124 of the shield 104 each include a thru-hole extending through the shield 104 with a diameter of about 0.02 inches (about 0.5 mm). The tabs 126 of each wing connector 122 are correspondingly configured (e.g., sized, shaped, constructed, etc.) to compressively squeeze or engagably fit within at least one of the corresponding holes 124 of the shield 104. In the illustrated embodiment, for example, the tabs 126 are each semi-circular in shape with radius dimensions of about 0.01 inches (about 0.25 millimeters). Accordingly, the two tabs 126 collectively define a generally circular shape with a diameter of about 0.02 inches (about 0.50 millimeters). Continuing with this example, the opening 124 of the shield 104 may have a corresponding or complementary circular shape, but with a smaller diameter (e.g., diameter slightly less than about 0.50 millimeters, etc.) than the generally circular shape collectively defined by the tabs 126. In other exemplary embodiments, one or more of the holes and/or wing connector tabs may be shaped differently and/or sized differently than disclosed herein within the scope of the present disclosure. For example, the tabs may be sized significantly larger than the holes into which they are received, for example, to provide an increased frictional connection between the tabs and the openings.

An exemplary process of coupling the gasket 106 to the shield 104 will now be described. Initially, the gasket 106 (with the tabs 126 having been pierced into the gasket 106 and in the first, pre-installed configurations shown in FIG. 5) is positioned relative to the shield 104 such that the wing connectors 122 (and the tabs 126) are adjacent to, and in general alignment with, the corresponding openings 124 of the shield 104. The tabs 126 of each wing connector 122 are then forcibly moved, pressed, pushed, bent, or deformed (e.g., by a tool, punch, etc.) generally away from the support 128 of the gasket 106 (in a generally downward direction as viewed in FIGS. 3 and 4). With the tabs 126 connected or hinged to the support 128 of the gasket 106, the tabs 126 thus move generally inwardly towards each other, which, in turn, reduces the diameter or size of the footprint of the tabs 126. This size reduction allows the tabs 126 to fit or compressively squeeze into the smaller corresponding opening 124 of the shield 104. In turn, this helps locate the gasket 106 in proper position relative to the shield 104 and helps secure the gasket 106 to and/or retain the gasket 106 on the shield 104. It should be appreciated that the tabs 126 may be positioned (e.g., bent, flexed, pushed, pressed, forced, compressively squeezed, etc.) into the opening 124 manually or by acceptable automated procedures (e.g., tooling, punch, etc.).

As the tabs 126 are bent or forced away from the gasket support 128, the tabs 126 are frictionally pushed into the respective openings 124 at least partly along inner surfaces or sidewalls of the openings 124. In other embodiments, the tabs 126 may be bent or forced away from the gasket support 128 in one operation, and then inserted into the openings 124 in a subsequent operation.

The tabs 126 resiliently engage the shield 104 within the openings 124 along the inner surfaces of the openings 124. This engagement helps frictionally retain the gasket 106 and the shield 104, for example, helps resist relative movement of the gasket 106 off the shield 104 (e.g., movement tending to move the tabs 126 out of the openings 124, etc.). In the illustrated embodiment, a single downward movement of, for example, a punch or other tool may be used to bend or hingedly move the tabs 126 of the wing connectors 122 generally away from the gasket support 128 and generally inwardly towards each other to fit into the respective openings 124 of the shield 104. As shown in FIG. 4, the tabs 126 do not extend completely through the openings 124 (e.g., free ends of the tabs 126 are retained within the openings 124) such that they do not interfere with installation of the shielding apparatus 100 to the PCB 102. It should be appreciated that the extent of the movement of the tabs 126 of the gasket 106 may be predetermined as desired to control the distance of insertion into the respective openings 124 of the shield 104. Some embodiments may have tabs 126 inserted to a greater or lesser extent into the openings 126 than what is shown in FIG. 4. For example, an exemplary embodiment may include tabs that are inserted completely through the hole and extend outwardly beyond the shield.

In some exemplary embodiments, shielding apparatus may include shields and gaskets in which the gaskets may be disconnected from and then reconnected to the shields. For example, after coupling the gaskets to the shields (e.g., using wing connectors, embossed protrusions, etc.), the gaskets may be disconnected from the shield, for example, to reposition, etc. the gaskets on the shields, and subsequently reconnected to the shields, for example for further processing, etc. of the shielding apparatus.

Figure 7:
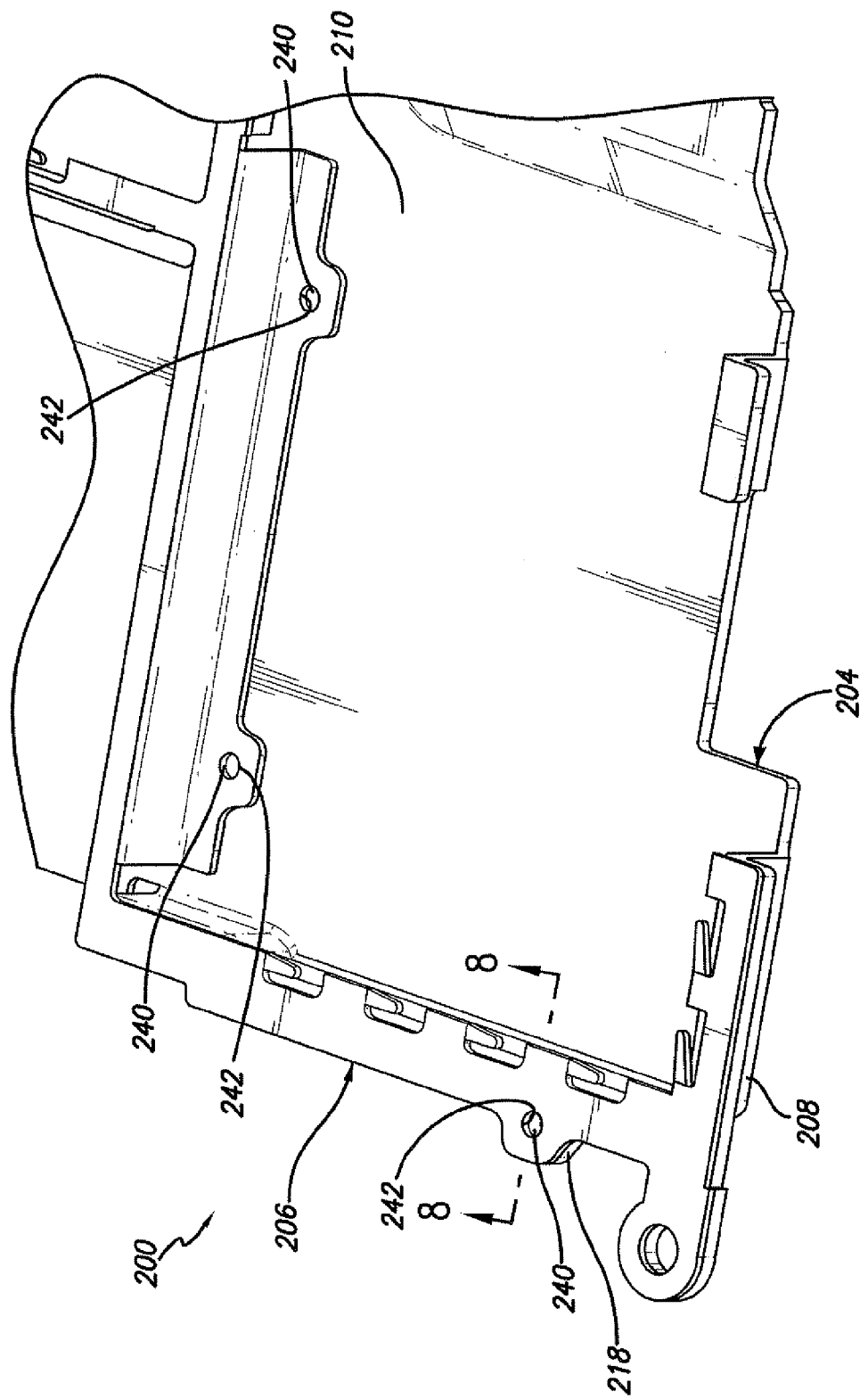
FIG. 7 is a fragmentary perspective view of another exemplary embodiment of a shielding apparatus that includes a shield and a gasket, where the gasket is retained to the shield by engagement of the shield's embossed protrusions within openings of the gasket.
Figure 8:
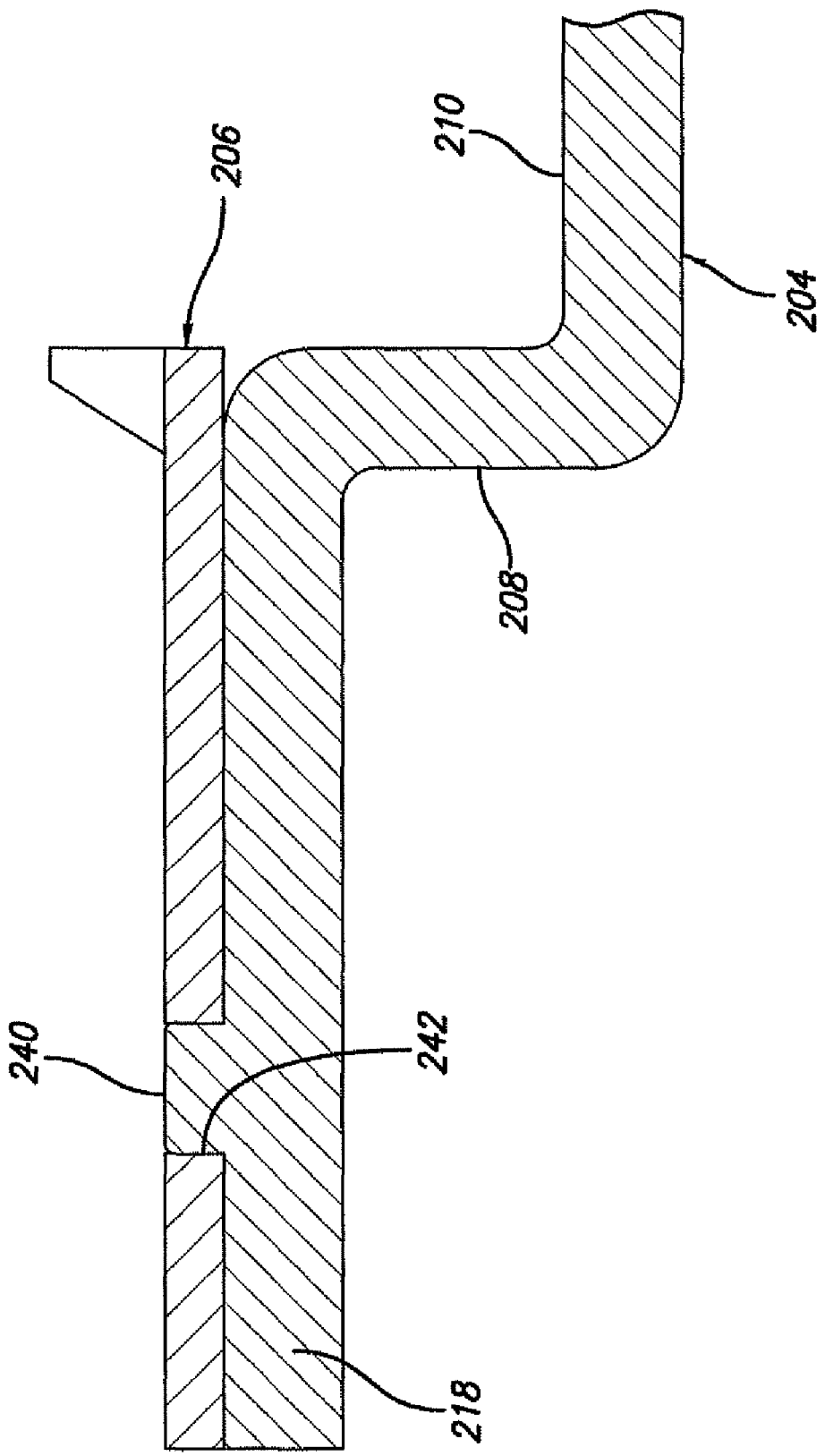
FIG. 8 is a section view taken in a plane including line 8-8 of FIG. 7, and illustrating engagement of an embossed protrusion of the shield within an opening of the gasket.

FIGS. 7 and 8 illustrate another exemplary embodiment of a shielding apparatus 200 embodying one or more aspects of the present disclosure. The illustrated shielding apparatus 200 generally includes a shield 204 and a gasket 206. The gasket 206 is shown coupled to the shield 204, for example, to provide an EMI shielding barrier between the shield 204 and a PCB (not shown) when the shield 204 is installed to a PCB for EMI shielding.

In this embodiment, the gasket 206 may be retained to the shield 204 at embossed protrusions 240 located along outwardly extending footing surfaces 218 of side walls 208 of the shield 204. The gasket 206 may also be retained to the shield 204 at select points on a cover 210 of the shield 204 at embossed protrusions 240 located along the cover 210. The embossed protrusions 240 are formed in the shield 204, for example, by deforming (e.g., punching, pressing, etc.) at least part of the shield 204 upward (as viewed in FIGS. 7 and 8). Openings 242 (e.g., thru-holes, etc.) in the gasket 206 are configured (e.g., sized, shaped, constructed, etc.) to fit over the embossed protrusions 240 and retain the gasket 206 to the shield 204. In the illustrated embodiment, the openings 242 of the gasket 206 are sized similarly or slightly smaller than the embossed protrusions 240 of the shield 204 (e.g., diameters of the openings 242 are similarly dimensioned or slightly smaller than the diameters of the corresponding protrusions 240) such that the protrusions 240 are frictionally retained within the openings 242 after the gasket 206 and shield 204 are retained together. In other exemplary embodiments, gaskets may include openings configured differently than corresponding embossed protrusions of shields, but still configured (e.g., sized, shaped, constructed, etc.) to help promote a relatively secure friction fit of the protrusion within the opening.

The connection between the shield 204 and the gasket 206 may help properly locate and initially retain the gasket 206 to the shield 204 prior to further installation and/or assembling procedures (e.g., welding the gasket 206 to the shield 204, installing the gasket 206 and shield 204 to a PCB, etc.). In addition, the embossed protrusions 240 of the shield 204 and the corresponding openings 242 of the gasket 206 may together be more broadly referred to as an example of a connector assemblies or, in the alternative, retention points for use in connecting the gasket 206 to the shield 204 and/or securing the gasket 206 to the shield 204 and/or retaining the gasket 206 on the shield 204.

An exemplary process of coupling the gasket 206 to the shield 204 will now be described. Initially, the gasket 206 is positioned relative to the shield 204 such that the gasket openings 242 are adjacent to, and in general alignment with, the embossed protrusions 240 of the shield 204. The gasket 206 is then moved (e.g., pressed, pushed, etc.) relatively onto the shield 204 such that the openings 242 of the gasket 206 fit over (e.g., frictionally, etc.) the corresponding embossed protrusions 240 of the shield 204 to form, for example, a snap-fit connection or snap-on connection, etc. therebetween. This connection helps couple (e.g., frictionally, etc.) the gasket 206 to the shield 204, for example, helps resist relative movement of the gasket 206 off the shield 204 (e.g., movement tending to move the gasket openings 242 off the shield embossed protrusions 240, etc.). It should be appreciated that the gasket 206 may be moved onto (e.g., snap-fitted or snapped onto, etc.) the shield 204 manually or by acceptable automated procedures.

Figure 9:
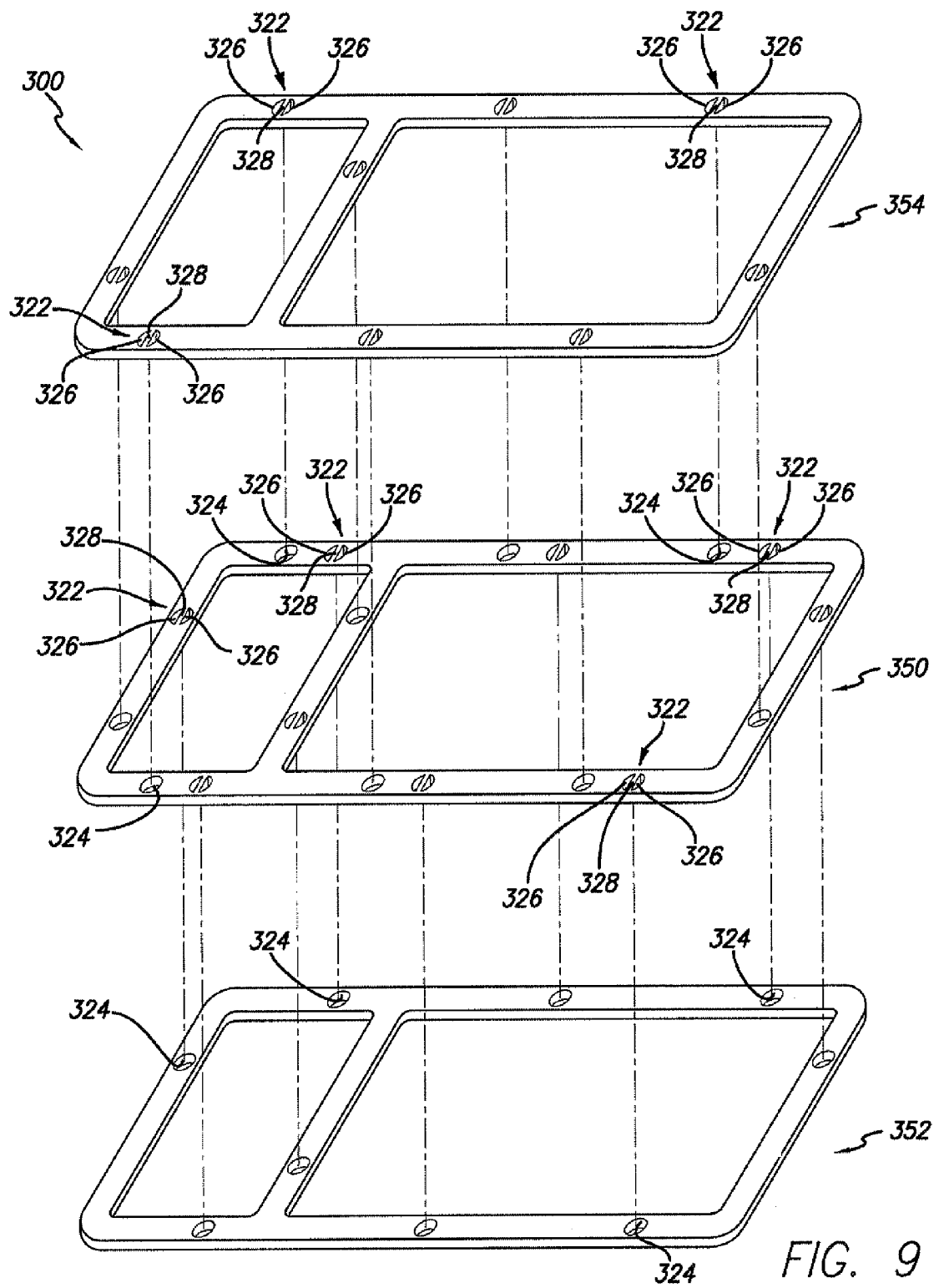
FIG. 9 is an exploded perspective view of an exemplary embodiment that includes individual components capable of being retained to each other by wing connectors.

FIG. 9 illustrates an exemplary embodiment of a multi-component apparatus 300 embodying one or more aspects of the present disclosure. The illustrated apparatus 300 generally includes a first component 350, a second component 352, and a third component 354. In this embodiment, the first component 350 may be coupled to the second component 352, and the third component 354 may be coupled to the first component 350.

As shown in FIG. 9, the first component 350 includes wing connectors 322 configured (e.g., sized, shaped, constructed, etc.) to fit into corresponding openings 324 (e.g., thru-holes, etc.) in the second component 352 to help locate the first component 350 in proper position relative to the second component 352 and help retain the first component 350 to the second component 352. The third component 354 includes wing connectors 322 configured (e.g., sized, shaped, constructed, etc.) to fit into corresponding openings 324 (e.g., thru-holes, etc.) in the first component 350 to help locate the third component 354 in proper position relative to the first component 350 (and coupled second component 352) and help retain the third component 354 to the first component 350 (and coupled second component 352). The wing connectors 322 may be used, for example, to properly locate and initially secure the components 350, 352, 354 together prior to further installation and/or assembling procedures (e.g., welding, the components 350, 352, 354 together, coupling the components 350, 352, 354 to additional components, etc.).

The illustrated wing connectors 322 are formed as part of the respective first and third components 350, 354 and generally each include two tabs, wings, or flaps 326 formed monolithically with the respective components 350, 354. The tabs 326 are formed by cutting (e.g., piercing, perforating, etc.) a part of the first and third components 350, 354. The cut tabs 326 remain connected to the first and third components 350, 354 at central supports 328 (which are part of the respective components 350, 354). The cut tabs 326 may also remain connected to the first and third components 350, 354 at any perforation points that may be left when the components 350, 354 are cut to form the tabs 326 (the tabs 326 may then be broken away from the respective components 350, 354 at the perforation points, while remaining connected to the components 350, 354 at the central supports 328, when the first, second, and third components 350, 352, 354 are coupled together).

The tabs 326 of each wing connector 322 are each configured (e.g., sized, shaped, constructed, etc.) to bend, deform, or move relative to the supports 328 away from the respective first and third components 350, 354 and in a generally downward direction (as viewed in FIG. 9). During this movement, the tabs 326 of a wing connector 322 move inwardly relatively to each other, thus allowing the tabs 326 to fit or compressively squeeze into a smaller diameter opening. For example, a tool (e.g., a punch, etc.) may be used to engage one or more of the tabs 326 of each wing connector 322 to bend, deform, or hingedly move the tabs 326 away from the respective components 350, 354 (and break the tabs 326 away from any perforation points left between the tabs 326 and the components 350, 354 when the components 350, 354 are cut to form the tabs 326) and move the tabs 326 into one of the corresponding openings 324 of the corresponding second and first components 352, 350. In the illustrated embodiment, the tabs 326 are each semi-circular in shape. In other exemplary embodiments, one or more tabs may be shaped differently than semi-circular.

An exemplary process of coupling the first, second, and third components 350, 352, 354 together will now be described. Initially, the first and second components 350, 352 are positioned such that the wing connectors 322 (and the tabs 326) of the first component 350 are adjacent to, and in general alignment with, the corresponding openings 324 of the second component 352. The tabs 326 of each wing connector 322 are then bent, flexed, or moved (e.g., by a tool, etc.) away from the first component 350 (in a generally downward direction as viewed in FIG. 9) and into a corresponding opening 324 of the second component 352. The positioning of the tabs 326 within the openings 324 helps locate the first component 350 in proper position relative to the second component 352 and helps secure or retain the first component 350 to the second component 352.

As the tabs 326 are bent, deformed, or moved away from the first component 350, they are frictionally pushed into the respective openings 324 of the second component 352 at least partly along inner surfaces of the openings 324. The tabs 326 resiliently engage (e.g., squeeze, etc.) the second component 352 within the openings 324 along the inner surfaces of the openings 324. This engagement helps frictionally connect the first and second components 350, 352, and helps resist relative movement of the first component 350 off the second component 352 and vice-versa (e.g., movement tending to move the tabs 326 out of the openings 324, etc.). In the illustrated embodiment, a single downward movement of, for example, a punch or other tool may bend, deform, or move the tabs 326 of the wing connectors 322 away from the first component 350 and into the respective openings 324 of the second component 352. The tabs 326 preferably do not extend through the openings 324 (e.g., free ends of the tabs 326 are retained within the openings 324) in this embodiment, so as to not interfere with connection of the first and/or second components 350, 352 to additional components.

The third component 354 may next be positioned relative to the coupled first and second components 350, 352 such that the wing connectors 322 (and the tabs 326) of the third component 354 are adjacent to, and in general alignment with, corresponding openings 324 of the first component 350. The tabs 326 of each wing connector 322 are then bent, flexed, or moved (e.g., by a tool, etc.) away from the third component 354 (in a generally downward direction as viewed in FIG. 9) and into a corresponding opening 324 of the first component 350 to help locate the third component 354 in proper position relative to the first component 350 (and coupled third component 354) and help secure or retain the third component 354 to the first component 350.

Again, as the tabs 326 are bent, deformed, or moved away from the third component 354, the tabs 326 are frictionally pushed into the respective openings 324 of the first component 350 at least partly along inner surfaces of the openings 324. The tabs 326 resiliently engage the first component 350 within the openings 324 along the inner surfaces of the openings 324. This engagement helps frictionally connect the third component 354 and the already coupled first and second components 350, 352, and helps resist relative movement of the first and second components 350, 352 off the third component 354 and vice-versa (e.g., movement tending to move the tabs 326 out of the openings 324, etc.). In the illustrated embodiment, a single downward movement of, for example, a tool may bend, flex, or move the tabs 326 of the wing connectors 322 away from the third component 354 and force the tabs 326 into the respective openings 324 of the first component 350. The tabs 326 preferably do not extend through the openings 324 (e.g., free ends of the tabs 326 are retained within the openings 324 and within the part's envelope) such that the tabs 326 do not interfere with the connection between the first and second components 350, 352.

The wing connectors 322 of the first component 350 and the corresponding openings 324 of the second component 352, and the wing connectors 322 of the third component 354 and the corresponding openings 324 of the first component 350 may together be broadly referred to as an example of a connector assembly, or, in the alternative, retention points for use in coupling the first, second, and third components 350, 352, 354 together. The illustrated apparatus 300 thus includes eighteen total retention points. In other exemplary embodiments, an assembly may include more than or less than eighteen total retention points, more or less than three components, and/or one or more retention points located at different locations than disclosed herein within the scope of the present disclosure.

In this embodiment, the first and second components 350, 352 are disclosed as being initially coupled together, and the third component 354 then being coupled to the first and second components 350, 352. The components 350, 352, 354 may be configured (e.g., sized, shaped, constructed, etc.) such that they can be coupled in different orders within the scope of the present disclosure. In other exemplary embodiments, components may be configured (e.g., sized, shaped, constructed, etc.) to be substantially simultaneously coupled together, or alternatively in no particular order. In further exemplary embodiments, multi-component apparatus may include more or less than three components within the scope of the present disclosure.

Numerical dimensions and values are provided herein for illustrative purposes only. The particular dimensions and values provided are not intended to limit the scope of the present disclosure.

Certain terminology is used herein for purposes of reference only, and thus is not intended to be limiting. For example, terms such as "upper," "lower," "above," "below," "top," "bottom," "upward," "downward," "upwardly," and "downwardly" refer to directions in the drawings to which reference is made. Terms such as "front," "back," "rear," "bottom," and "side," describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," "third," and other such numerical terms referring to structures do not imply a sequence or order unless clearly indicated by the context.

When introducing elements or features and the exemplary embodiments, the articles "a," "an," "the," and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An electromagnetic interference (EMI) shielding apparatus comprising:
    a shield having a surface and at least one opening pre-formed in the shield; and
    a gasket securable to the surface of the shield,
    at least one support formed monolithically with the gasket,
    at least one tab formed monolithically with the gasket and attached to the support, the at least one tab movable relative to the support from a pre-installed configuration in which the at least one tab is generally co-planar with the support to an installed configuration in which the at least one tab extends generally outwardly relative to the support, whereby movement of the at least one tab from the pre-installed configuration to the installed configuration positions the at least one tab at least partially within the at least one opening pre-formed in the shield, such that frictional engagement of the at least one tab within the at least one opening upon movement of the at least one tab from the pre-installed configuration to the installed configuration helps mechanically secure the gasket directly to the shield and retain the relative positioning of the gasket to the shield.

2. The apparatus of claim 1, wherein the at least one tab is forcibly insertable into the at least one opening upon application of force to the at least one tab.

3. The apparatus of claim 1, wherein the at least one tab in the installed configuration is slanted generally downwardly relative to the support of the gasket.

4. The apparatus of claim 3, wherein the at least one tab in the installed configuration is slanted relative to the support at an angle of about 45 degrees.

5. The apparatus of claim 1, wherein the at least one tab is forcibly movable from the pre-installed configuration to the installed configuration and into engagement within the at least one opening of the shield by a force applied to the at least one tab with a single stroke of movement of a tool in a direction generally parallel to a direction of movement of the at least one tab.

6. The apparatus of claim 1, wherein:
    the at least one opening of the shield has a depth; and
    the at least one tab in the installed configuration extends into the at least one opening a distance less than the depth of the at least one opening.

7. The apparatus of claim 1, wherein the at least one tab in the installed configuration does not penetrate completely through the at least one opening, such that a free end portion of the at least one tab is confined within the at least one opening.

8. The apparatus of claim 1, wherein the at least one tab includes at least two tabs formed monolithically with the gasket and depending from generally opposite sides of the support, each of said at least two tabs being movable relative to the support from the pre-installed configuration in which the corresponding tab is generally co-planar with the support to the installed configuration in which the corresponding tab extends generally outwardly relative to the support at least partially within the at least one opening of the shield.

9. The apparatus of claim 8, wherein the at least two tabs in the first configuration collectively define a footprint larger than the size of the at least one opening of the shield, and wherein movement of the at least two tabs from the pre-installed configuration to the installed configuration reduces the footprint collectively defined by the at least two tabs thereby allowing the at least two tabs to fit at least partially into the at least one opening of the shield.

10. The apparatus of claim 8, wherein the at least two tabs define a wing connector.

11. The apparatus of claim 10, wherein the gasket includes two or more of said wing connector.

12. The apparatus of claim 8, wherein the at least two tabs are each generally semi-circular in shape.

13. The apparatus of claim 1, wherein the shield includes a one piece shield having side walls and a cover.

14. The apparatus of claim 13, wherein at least one of the side walls of the shield includes the surface to which the gasket is securable.

15. The apparatus of claim 1, wherein:
    the relative position of the gasket to the shield is retained by the frictional engagement of the at least one tab in the installed configuration within the at least one opening, prior to welding of the gasket to the shield; and
    the gasket is welded to the surface of the shield by a weld.

16. The apparatus of claim 1, wherein the at least one tab, the support, and the gasket are substantially simultaneously formed from a single blank of material.

17. The apparatus of claim 1, wherein the gasket comprises a finger gasket including at least one resilient spring finger along a surface of the gasket generally opposite the at least one tab, for contacting a printed circuit board to provide an electrical grounding pathway between the gasket and the printed circuit board.

18. An electrical device including a printed circuit board and the apparatus of claim 1, wherein the shield is attached to the printed circuit board and the gasket is secured to the shield.

19. A gasket for attachment to an electromagnetic interference (EMI) shielding structure having at least one pre-existing opening, the gasket comprising:
    at least one support formed monolithically with the gasket,
    at least one flap formed monolithically with the gasket and attached to the support, the at least one flap forcibly movable relative to the support from a pre-installed configuration in which the at least one flap is generally co-planar with the support to an installed configuration in which the at least one flap extends generally outwardly relative to the support, whereby movement of the at least one flap from the pre-installed configuration to the installed configuration positions the at least one flap at least partially within the at least one pre-existing opening of the shield, such that frictional engagement of the at least one flap within the at least one opening upon movement of the at least one tab from the pre-installed configuration to the installed configuration helps mechanically secure the gasket directly to the shield and retain the relative positioning of the gasket to the shield.

20. The gasket of claim 19, wherein the gasket includes at least two flaps defining a wing connector.

21. The gasket of claim 20, wherein each flap is generally semi-circular in shape.

22. The gasket of claim 20, wherein the gasket includes at least one resilient spring finger along a surface of the gasket generally opposite the flaps, for contacting a printed circuit board to provide an electrical grounding pathway between the gasket and the printed circuit board.

23. The gasket of claim 19, wherein the at least one opening of the shield includes at least one pre-existing thru-hole, and wherein the at least one flap of the gasket is configured such that the at least one flap extends generally outwardly relative to the support and into the at least one pre-existing thru-hole of the shield in the installed configuration.

24. The gasket of claim 19, wherein the at least one opening of the shield and the at least one flap of the gasket are located along the shield and gasket, respectively, such that frictional engagement of the at least one flap within the at least one opening properly locates the gasket to the shield.

25. The gasket of claim 19, wherein the at least one flap of the gasket is configured such that frictional engagement of the at least one flap within the at least one opening only initially secures the gasket to the shield, prior to welding or mechanical fastening of the gasket to the shield.

26. The gasket of claim 19, wherein the at least one flap of the gasket is configured such that frictional engagement of the at least one flap within the at least one opening securely retains the gasket to the shield, without any need for further securement, welding, or mechanical fastening of the gasket to the shield.

27. The apparatus of claim 1, wherein the at least one opening pre-formed in the shield includes at least one thru-hole.

28. The apparatus of claim 1, wherein the at least one opening of the shield and the at least one tab of the gasket are located along the shield and gasket, respectively, such that frictional engagement of the at least one tab within the at least one opening properly locates the gasket to the shield.

29. The apparatus of claim 1, wherein the at least one opening of the shield and the at least one tab of the gasket are configured such that frictional engagement of the at least one tab within the at least one opening only initially secures the gasket to the shield, prior to welding or mechanical fastening of the gasket to the shield.

30. The apparatus of claim 1, wherein the at least one opening of the shield and the at least one tab of the gasket are configured such that frictional engagement of the at least one tab within the at least one opening securely retains the gasket to the shield, without any need for further securement, welding, or mechanical fastening of the gasket to the shield.

31. An electromagnetic interference (EMI) shielding apparatus comprising:
   a shield having a surface and at least one thru-hole in the shield; and
   a gasket securable to the surface of the shield, the gasket having a peripheral edge portion, the gasket including at least one support located inwardly of the peripheral edge portion of the gasket and at least one wing formed depending outwardly from the at least one support, the at least one wing located inwardly of the peripheral edge portion of the gasket;
   the at least one wing frictionally engageable within the at least one thru-hole pre-existing in the shield, to thereby help locate the gasket relative to the shield, at least initially mechanically secure the gasket directly to the shield, and retain the relative positioning of the gasket to the shield.

32. The apparatus of claim 31, wherein the gasket includes at least two wings defining a wing connector.

33. The apparatus of claim 31, wherein the at least one wing is configured to be moved generally away from the gasket and at least partially into the at least one thru-hole in the shield, and wherein such movement of the at least one wing at least partially secures the gasket to the shield.

34. An electromagnetic interference (EMI) shielding apparatus comprising:
   a shield having a surface and at least one thru-hole in the shield; and
   a gasket including at least one support, at least two flaps depending outwardly from the at least one support and defining a wing connector, and at least one resilient spring finger along a surface of the gasket generally opposite the flaps;
   the at least two flaps are frictionally engageable within the at least one thru-hole pre-existing in the shield, to thereby help locate the gasket relative to the shield, at least initially mechanically secure the gasket directly to the shield, and retain the relative positioning of the gasket to the shield;
   the at least one resilient spring finger configured for contacting a printed circuit board to provide an electrical grounding pathway between the gasket and the printed circuit board.

35. The apparatus of claim 1, wherein the gasket includes a peripheral edge portion, and wherein the at least one tab is located inwardly of the peripheral edge portion of the gasket.

36. The apparatus of claim 19, wherein the gasket includes a peripheral edge portion, and wherein the at least one flap is located inwardly of the peripheral edge portion of the gasket.

37. A gasket for attachment to an electromagnetic interference (EMI) shielding structure having at least one pre-existing opening, the gasket comprising:
   a peripheral edge portion;
   at least one support formed monolithically with the gasket and located inwardly of the peripheral edge portion;
   at least one flap formed monolithically with the gasket and attached to the support, the at least one flap located inwardly of the peripheral edge portion;
   wherein the at least one flap is configured to be moved relative to the support generally away from the gasket and at least partly into at least one pre-existing opening of an EMI shielding structure, and wherein such movement of the at least one flap at least partly secures the gasket to the shield.

* * * * *

UNITED STATES PATENT AND TRADEMARK OFFICE
CERTIFICATE OF CORRECTION

PATENT NO. : 7,889,515 B2  
APPLICATION NO. : 12/046434  
DATED : February 15, 2011  
INVENTOR(S) : Joseph C. Boetto et al.

It is certified that error appears in the above-identified patent and that said Letters Patent is hereby corrected as shown below:

CLAIM 31  
Column 15, line 44: replace "haying" with "having"

Signed and Sealed this  
Tenth Day of May, 2011

David J. Kappos  
*Director of the United States Patent and Trademark Office*